United States Patent [19]
Katoh

[11] Patent Number: 5,010,382
[45] Date of Patent: Apr. 23, 1991

[54] HETEROJUNCTION BIPOLAR TRANSISTOR HAVING DOUBLE HETERO STRUCTURE

[75] Inventor: Riichi Katoh, Yokohama, Japan

[73] Assignee: Kabushiki Kaisha Toshiba, Kawasaki, Japan

[21] Appl. No.: 445,984

[22] Filed: Dec. 4, 1989

[30] Foreign Application Priority Data

Dec. 9, 1988 [JP] Japan .................................. 63-311753
Feb. 14, 1989 [JP] Japan .................................. 1-34405

[51] Int. Cl.$^5$ ...................... H01L 29/72; H01L 27/12; H01L 29/161
[52] U.S. Cl. .......................................... 357/34; 357/4; 357/16
[58] Field of Search ................... 357/34, 4, 16, 34 HB

[56] References Cited

FOREIGN PATENT DOCUMENTS 59-211267 5/1983 Japan .
60110159 11/1983 Japan .

OTHER PUBLICATIONS

"Heterostructure Bipolar Transistors and Integrated Circuits", Proceedings of the IEEE, vol. 70 No. 1, Jan. 1982, pp. 13–25, Herbert Kroemer.
"A Self-Consistent Particle Simulation for (AlGa)As/Ga HBTS with Improved Base-Collector Structures", Reprinted from Proceedings of the IEDM-International Electron Devices Meeting, Washington, D.C. Dec. 6–9, 1987 Riichi Katoh et al., pp. 248–251.
"A Proposed Structure for Collector Transit-Time Reduction in AlGaAs/GaAs Bipolar Transistors", IEEE Electron Device Letters, vol. ED1-7, No. 8, Aug. 1986, C. M. Maziar et al., pp. 483–485.

Primary Examiner—Rolf Hille
Assistant Examiner—R. Potter
Attorney, Agent, or Firm—Oblon, Spivak, McClelland, Maier & Neustadt

[57] ABSTRACT

A double heterojunction bipolar transistor which comprises a first conductivity type emitter layer, a second conductivity type base layer which is in contact with the emitter layer and forms a first heterojunction in conjunction with the emitter layer, and a collector layer which is in contact with the base layer and is made up of a first conductivity type semiconductor layer and a second conductivity type semiconductor layer. The collector layer includes a low-impurity concentration layer which is in contact with the base layer. The low-impurity concentration layer has the same conductivity type as the base layer and has an impurity concentration lower than that of the base layer. The collector layer forms a second heterojunction in conjunction with the base layer. The emitter layer and the collector layer are formed of a semiconductor material having a band gap wider than that of the base layer.

10 Claims, 15 Drawing Sheets

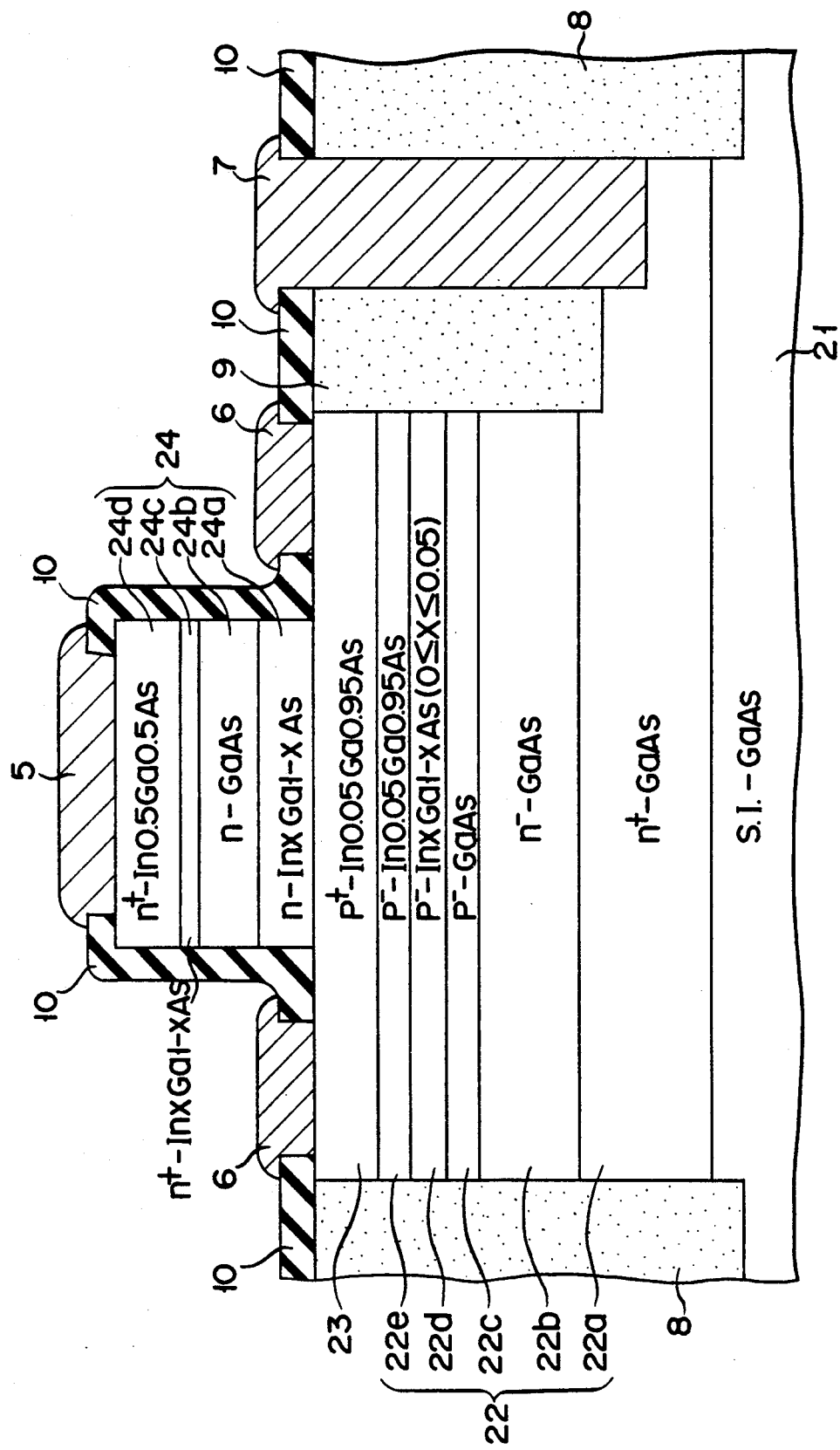
F I G. 14

HETEROJUNCTION BIPOLAR TRANSISTOR HAVING DOUBLE HETERO STRUCTURE

BACKGROUND OF THE INVENTION

1. Field of the Invention

The present invention relates to a heterojunction bipolar transistor (HBT) which has a double hetero structure and in which the emitter and collector regions are formed of a semiconductor material having a wider band gap than that of the material of the base region.

2. Description of the Related Art

A heterojunction bipolar transistor is good in both high-frequency and switching characteristics, and is therefore promising for use as a transistor which is adapted for use with microwaves or a transistor which is adapted to perform high-speed logical operations.

In general, a cutoff frequency $f_T$ is one of the indexes of the speed performance of a bipolar transistor. In the case of an npn transistor, the cutoff frequency $f_T$ is expressed as an inverse number of the transit time of electrons in an element. In order to obtain a high cutoff frequency $f_T$, therefore, it is necessary to shorten the transit time of electrons. The transit time $\tau$ of electrons in an element is determined by the following factors: an emitter charging time $\tau_E$; a base transit time $\tau_B$; and the sum $\tau_C$ of the collector charging time and the collector transit time. Of these factors, the base transit time $\tau_B$ is not dependent on the current density and is substantially constant, while the emitter charging time $\tau_E$ decreases with the current density and takes a value far smaller than 1 psec when the transistor is operated with a high current density (i.e., when the transistor is operated with a current density which is in the region between the latter half of the order of $10^4$ A/cm$^2$ and a value slightly exceeding $10^5$ A/cm$^2$).

The sum $\tau_C$ of the collector charging time and the collector transit time will be considered. Like the emitter charging time, the collector charging time which is due to the collector junction capacitance decreases with an increase in the current density. However, the collector transit time cannot be fully decreased. Particularly in the case of a conventional semiconductor structure having a homo-junction defined by a p+ base and an n− collector, electrons travel through the high electric field of a collector depletion layer at a saturation velocity as small as $1 \times 10^7$ cm/sec or less. Since the collector transit time is lengthened if the depletion layer widens, it is safe to say that the collector transit time increases in proportion to the width of the depletion layer. Therefore, the sum $\tau_C$ of the collector charging time and the collector transit time is the most influential factor for determining the cutoff frequency $f_T$.

In order to reduce the sum $\tau_C$ of the collector charging time and the collector transit time, various proposals have been made up to the present. For example, R. Katoh et al. disclose an element construction effective in reducing the sum, in "A Self-Consistent Particle Simulation For (Al Ga)As/GaAs HBTs with Improved Base-Collector Structures", Technical Digest of the IEDM-International Electron Devices Meeting, Washington, D.C., Dec. 6–9, 1987, pp. 248 to 251. This reference shows an npn transistor wherein a p−-type layer is formed in that region of the n-type collector layer which is in contact with the base layer. That is, what the reference shows is a so-called HBT having a p−-type collector.

FIG. 1 is a sectional view of the HBT disclosed in U.S. patent application Ser. No. 214,058. The HBT of this reference uses a material based on (Al Ga)As/GaAs and has a p−-type collector. The collector layer 32 of this element is made up of: an n+-type GaAs layer 32a, an n−-type GaAs layer 32b, and a p−-type GaAs layer 32c, and forms a homo-junction in conjunction with a base layer 33. The impurity concentration in the P−-type GaAs layer 32c is lower than that of the n−-type GaAs layer 32b. The electric field in the collector region is weakened by the p−-n− junction. Since, therefore, the overshoot of the electron velocity occurs, the collector transit time of electrons can be such a small value as is not determined by the electron saturation velocity.

However, when the current density is in the latter half of the order of $10^4$ A/cm$^2$, the electrons stored in the collector cannot be neglected though the electron velocity in the collector is high. Due to the space-charge effect caused by the stored electrons, the holes stored in the collector cannot be neglected, either. To explain this phenomenon, a Monte Carlo simulation was carried out. The calculation results of this simulation are shown in FIG. 2. As is shown in FIG. 2, the carrier profile of holes gradually extends into the region of the p−-type collector, and the depletion layer of the collector is narrowed, accordingly. Therefore, the collector junction capacitance increases with an increase in the current density. Since an increase in the collector junction capacitance results in a decrease in both the cutoff frequency $f_T$ and the maximum oscillation frequency $f_{MAX}$, the switching characteristic of the transistor is greatly affected. Further, when the element is operated at a high current density, the heat generated by the element cannot be neglected, with the result that phonon scattering becomes more noticeable. Since, therefore, the electron velocity in the collector decreases, the collector junction capacitance is considered to increase at a higher rate in accordance with an increase in the current density. It should be also noted that the collector junction capacitance of a p−-type collector structure is higher than that of a n−-type collector structure.

In almost every region of the current density, a heterojunction bipolar transistor including a p−-type collector layer has a cutoff frequency higher than that of a heterojunction bipolar transistor including a n−-type collector layer. Therefore, the former heterojunction bipolar transistor is expected to operate at a higher speed than before, if both the cutoff frequency $f_T$ and the maximum oscillation frequency $f_{MAX}$ are prevented from decreasing in a high current density region.

SUMMARY OF THE INVENTION

The first object of the present invention is to provide a heterojunction bipolar transistor wherein the collector transit time of electrons is remarkably short and wherein the collector junction capacitance is prevented from increasing even in a high current density region.

The second object of the present invention is to provide a super high-speed heterojunction bipolar transistor wherein both the cutoff frequency $f_T$ and the maximum oscillation frequency $f_{MAX}$ are remarkably high in every current density region.

To achieve these objects, the present invention provides first to fourth heterojunction bipolar transistors.

The first heterojunction bipolar transistor of the present invention has a double hetero structure wherein emitter and collector layers are formed of a material having a wider band gap than that of a base region. In addition, the collector layer is made up of at least two semiconductor layers. Of these semiconductor layers, the semiconductor layer located closer to the base layer than the other semiconductor layer or layers is of the same conductivity type as the base layer and has an impurity concentration lower than that of the base layer. This semiconductor layer of the collector layer will be hereinafter referred to as a low impurity concentration layer.

The second heterojunction bipolar transistor of the present invention has a similar structure to that of the first one, but differs from the first one in that it additionally comprises a transition layer whose band gap varies stepwise or smoothly. The transition layer is formed at least at the heterojunction between the base and collector layers such that it is isolated from the base layer and extends from the low impurity concentration layer toward the collector. Alternatively, the transition layer may be formed in the collector layer located on the outer side of the low impurity concentration layer.

In the case where the transition layer is formed in the collector layer, it may extend from that portion of the collector layer which is in contact with the base. It may extend up to the semiconductor layer isolated from the base layer, or may be formed within that semiconductor layer. If the transition layer is formed in contact with the low impurity concentration layer, it must be kept isolated from a neutral charge region. If the transition layer extends up to the neutral charge region, the conduction band of the neutral charge region will a have hump in the case where positive electron energy is plotted upward, so that electrons are prevented from being injected into the collector.

The third heterojunction bipolar transistor of the present invention has a similar structure to that of the second one, but differs from the second one in that the transition layer is formed in the low impurity concentration layer of the collector layer such that the transition layer is isolated from the base layer and from the collector layer having a different conductivity type from that of the base layer.

In the third heterojunction bipolar transistor, the transition layer of the collector layer can be located as close as possible to the base layer with no need to form an electron-blocking layer in the conduction band. Therefore, holes are prevented from being injected into the collector layer.

The fourth heterojunction bipolar transistor of the present invention has a similar structure to the first one, except for the structure of the collector layer. Specifically, the collector layer is made up of: a first collector layer in contact with the base layer and having the same conductivity type as the base layer; a second collector layer formed under the first collector layer and having a different conductivity type from that of the base layer; and a third collector layer formed under the second collector layer and having the same conductivity type as the second collector layer. The impurity concentrations of the first through third collector layers satisfy the following relations:

$$N_1 < N_2 \leq N_3 \quad (1)$$

where $N_1$, $N_2$ and $N_3$ denote the impurity concentrations of the first through third collector layers, respectively.

In the fourth heterojunction bipolar transistor, the first collector layer is formed such that it is not completely depleted at least when no bias is applied.

Assuming that the emitter of the first heterojunction bipolar transistor is formed of an n-type semiconductor material, electrons are first accelerated due to the potential drop caused between the $p^+$-type base and the $p^-$-type collector. That portion of the collector region which is continuous to the $p^-$-type collector has a low impurity concentration, so that the conduction band varies gradually. Thus, the electrons are accelerated again without causing intervalley scattering. Therefore, the velocity overshoot of electrons occurs in the entire collection region. Moreover, since the collector layers are formed of a semiconductor material having a wide band gap, holes are restrained from being injected into the collector. Since the collector depletion layer is prevented from becoming narrower even when the heterojunction bipolar transistor is operated at a high current density, the collector junction capacitance does not increase. Thus, the first heterojunction bipolar transistor has a high cutoff frequency $f_T$ and a high maximum oscillation frequency $f_{MAX}$.

In the second heterojunction bipolar transistor, the band gap transition layer of the collector region extends from a low-impurity concentration layer of the collector layer to the remaining region of the collector layer. The low-impurity conentration layer is located close to the base layer and has the same conductivity type as the base layer. As mentioned above, the band gap transition layer may be formed in that region of the collector layer which is isolated from the base layer. With this construction, the conduction band of the collector region is prevented from becoming convex. If the transition layer is formed in such a manner as to extend into the collector region from the junction between the $p^+$-type base and $p^-$-type collector, the conduction band of the collector region becomes convex, as is shown in FIG. 3. Therefore, the electrons injected from the base toward the collector are blocked by a potential barrier and therefore cannot easily reach the collector electrode. The reason that the conduction band of the collector region becomes convex is attributed to formation of the transition layer in the neutral region of the $p^-$-type collector. Therefore, the disadvantage mentioned above does not occur by forming the transition layer in such a manner as in the second heterojunction bipolar transistor.

The third heterojunction bipolar transistor of the present invention has a similar structure to that of the second one, but differs from the second one in that the band gap transition layer of the collector region is formed within a low-impurity concentration layer of the collector layer. The low-impurity concentration layer is located close to the base layer and has the same conductivity type as the base layer. With this structure the potential barrier of the conduction band with reference to holes (the potential barrier being produced by the collector having a wide band gap) is formed at a location which is as close as possible to the base layer. As a result, in the collector region, the holes contributing to the collector junction capacitance are spatially separated from the electrons. Therefore, the collector junction capacitance is prevented from increasing at the time of a thermal equilibrium state. In addition, the space-charge effect at the time of operation with a high current density does not cause the depletion layer to become narrow. Consequently, the collector junction capacitance is prevented from increasing even if the transistor is set in an arbitrary state.

The fourth heterojunction bipolar transistor of the present invention has a similar structure to the first one, but differs from the first one in that the impurity concentration in the collector layer satisfies the relation (1) mentioned above and in that the first collector is not completely depleted at least when no bias is applied. If the first collector is completely depleted, the conduction band between the base and the first collector layer abruptly bend, so that the base and the second collector are substantially connected together. As a result, the electrons cause intervalley scattering as soon as they enter the collector layer. In the fourth heterojunction bipolar transistor, in contrast, the electrons injected from the base into the collector are accelerated, due to the potential difference caused by the junction between the high impurity concentration base and the low impurity concentration layer of the collector. The electrons are further accelerated, without causing intervalley scattering, in the collector layer which has a junction formed by semiconductor layer having a low impurity concentration and different in conductivity type, because the band shape of the collector layer gradually varies. As a result, the velocity overshoot of electrons occurs in the entire collector region.

BRIEF DESCRIPTION OF THE DRAWINGS

Other objects and advantages will be apparent from the following description taken in conjunction with the accompanying drawings, in which:

FIG. 14 is a sectional view of the heterojunction bipolar transistor according to the eighth embodiment of the present invention.

DETAILED DESCRIPTION OF THE PREFERRED EMBODIMENTS

Figure 1:
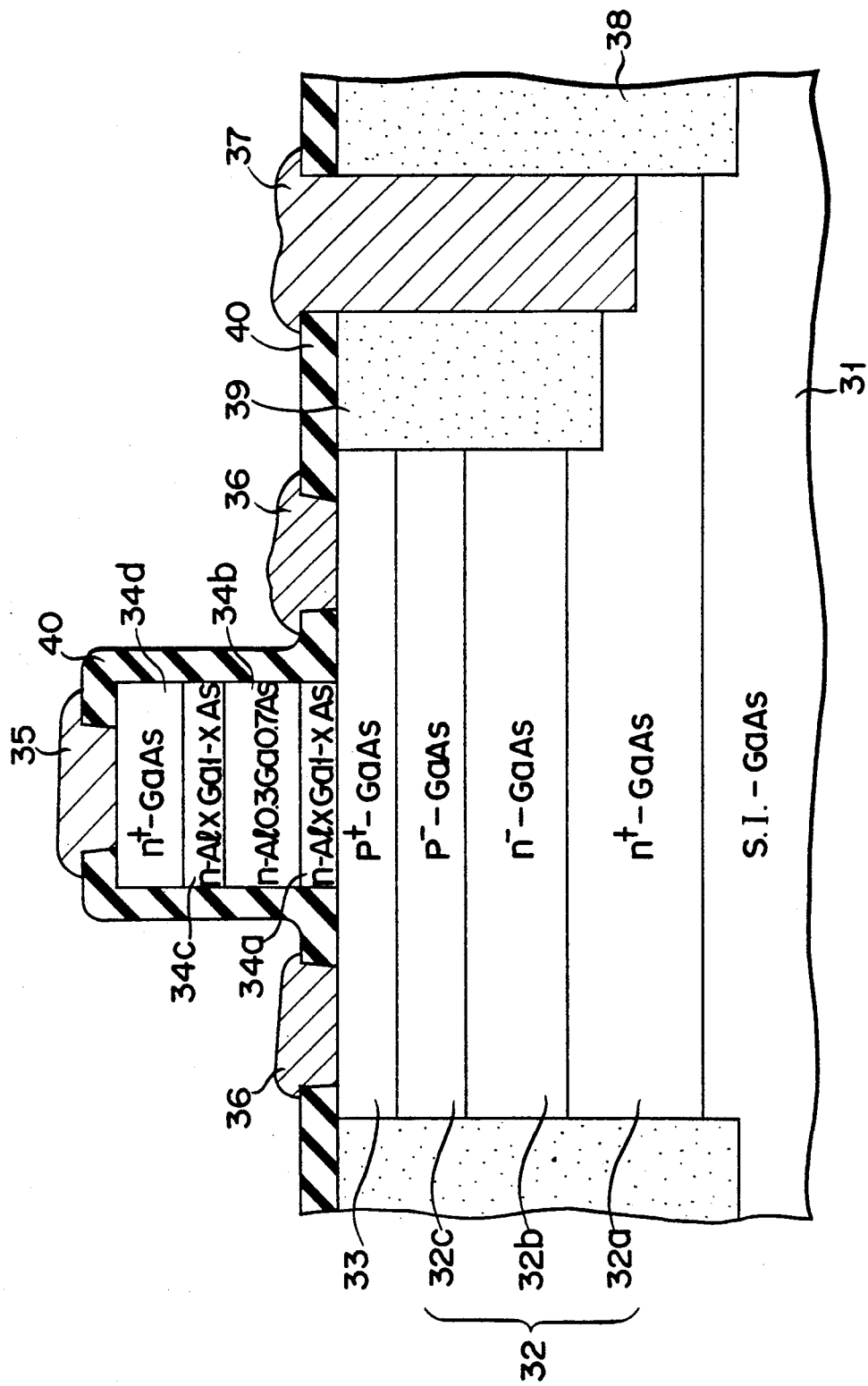
FIG. 1 is a sectional view of the heterojunction bipolar transistor disclosed in U.S. patent Application Ser. No. 214,058.
Figure 2:
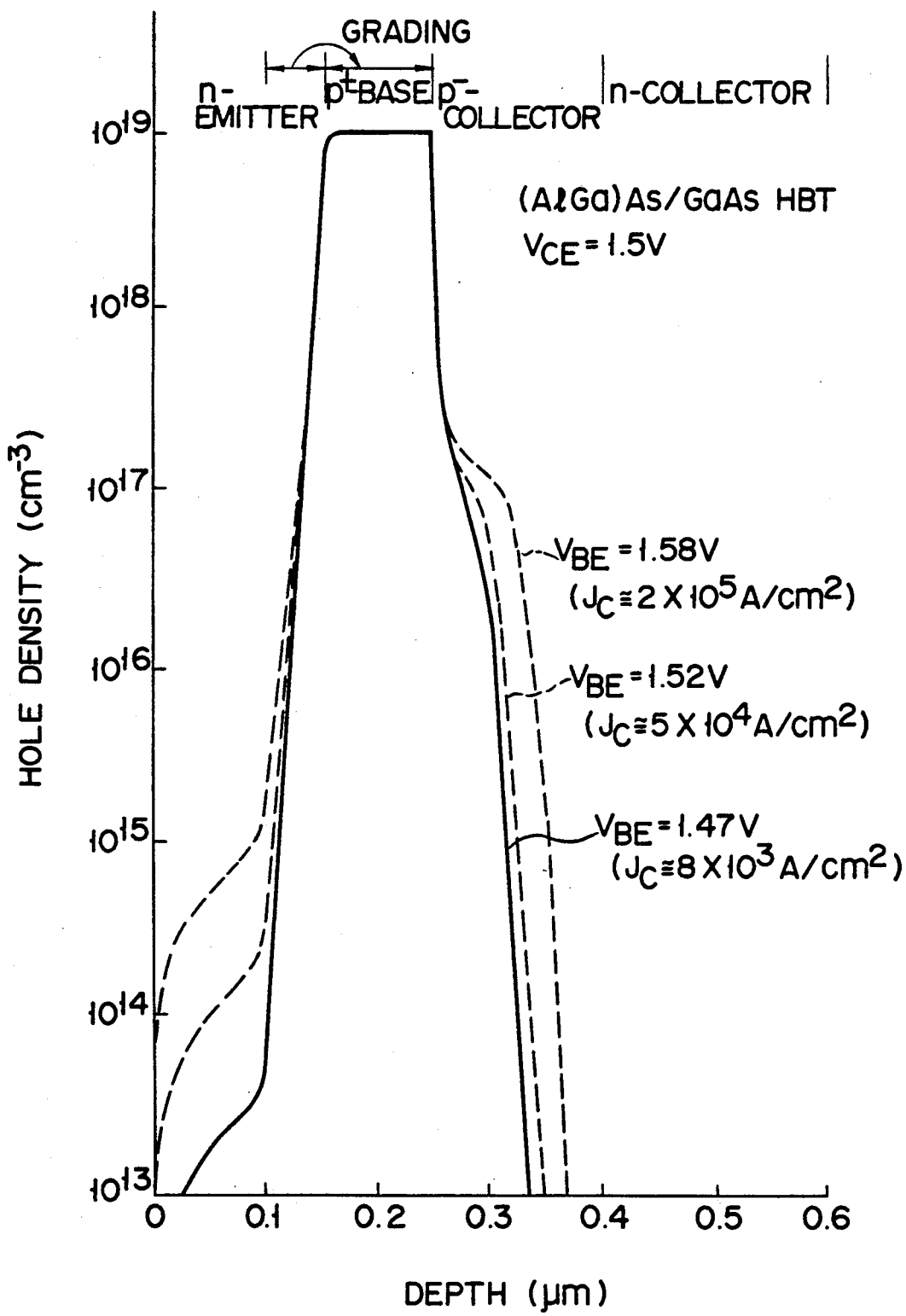
FIG. 2 is a graph showing the hole carrier profile obtained when the transistor shown in FIG. 1 is operated.
Figure 3:
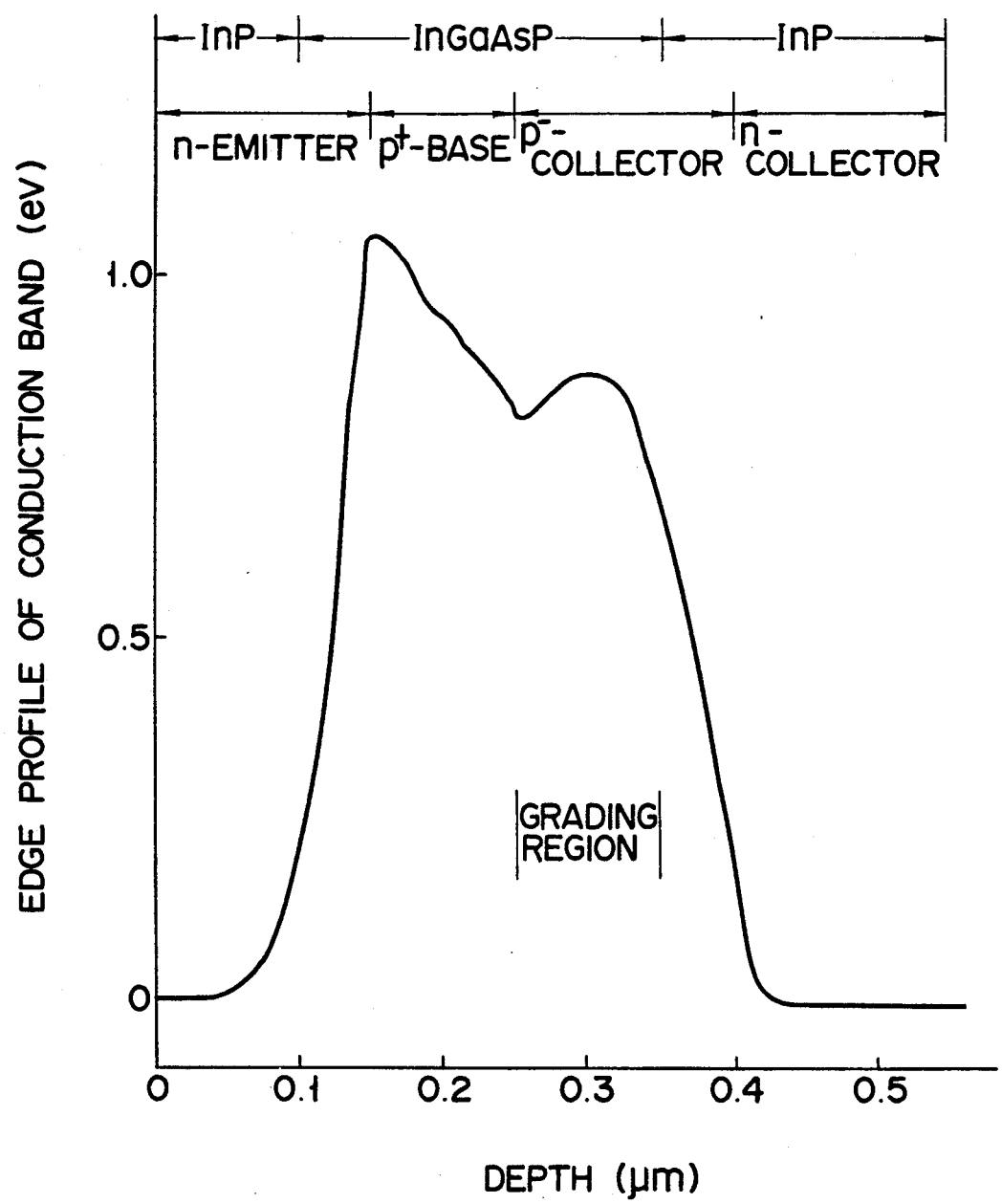
FIG. 3 is a graph showing the edge profile of a conduction band and explaining how a potential barrier is produced in the conduction band in relation to the location of the transition layer in the collector region.

The heterojunction bipolar transistor of the first embodiment of the present invention will now be described, with reference to FIG. 4. This heterojunction bipolar transistor is formed of InP/InGaAs-based materials and obtained by forming a collector layer 2, a base layer 3 and an emitter layer 4 on a semi-insulating InP substrate 1. The collector layer 2 is an n-type layer made up of: a high-impurity concentration $n^+$-type InP layer 2a (i.e., a third collector); a low-impurity concentration $n^-$-type InP layer 2b (i.e., a second collector) formed on the $n^+$- type InP layer 2a; and a $p^-$-type collector 2c, 2d, 2e (i.e., a first collector) formed on the $n^-$-type InP layer 2b. The $p^-$-type collector serving as the first collector includes: a $p^-$-type InP layer 2c; a $p^-$-type $In_{1-x}Ga_xAs_yP_{1-y}$ layer 2d; formed on the $p^-$-type InP layer 2c; and a $p^-$-type $In_{0.53}Ga_{0.47}As$ layer 2e formed on the $p^-$-type $In_{1-x}Ga_xAs_yP_{1-y}$ layer 2d. The $p^-$-type $In_{1-x}Ga_xAs_yP_{1-y}$ layer 2d is a transition layer serving to smoothly vary the band gap between the base layer 3 and the $n^-$-type InP layer 2b (i.e., the second collector). The transition layer is obtained by changing the composition ratios x and y either steplessly or stepwise. In the first embodiment, the following relation is established:

$$N_1 < N_2 \leq N_3$$

where $N_1$, $N_2$ and $N_3$ denote the impurity concentrations of the first through third collector layers, respectively. The base layer 3 is either a $p^+$-type $In_{0.53}Ga_{0.47}As$ layer or an $In_{1-x}Ga_xAs_yP_{1-y}$ layer. The emitter layer 4 is made up of: an n-type $In_{1-x}Ga_xAs_yP_{1-y}$ layer 4a; an n-type InP layer 4b formed on the n-type $In_{1-x}Ga_xAs_yP_{1-y}$ layer 4a; and an $n^+$-type InP layer 4c formed on the n-type InP layer 4b and serving as an emitter cap layer. The n-type $In_{1-x}Ga_xAs_yP_{1-y}$ layer 4a a transition layer serving to smoothly vary the band gap between the base layer 3 and the InP layer 4b (i.e., an emitter).

To manufacture the transistor mentioned above, semiconductor layers have to be epitaxially grown on the semi-insulating InP substrate 1. For this epitaxial growth, either a gas source molecular beam epitaxy process (i.e., a GSMBE process) or a low-pressure organic metal chemical vapor deposition process (i.e., a LPMOCVD process) is used. The specific manufacturing conditions will be explained according to the steps.

First, the $n^+$-type InP layer 2a having an Sn impurities) concentration of $2 \times 10^{18}$ cm$^{-3}$ and a thickness of 500 nm is epitaxially grown on the semi-insulating InP substrate 1. On this $n^+$-type InP layer 2a, the $n^-$-type InP layer 2b having an impurity concentration of $4 \times 10^{17}$ cm$^{-3}$ and a thickness of 200 nm is epitaxially grown.

Next, the $p^-$-type InP layer 2c having a Cd (impurities) concentration of $1 \times 10^{17}$ cm$^{-3}$ and a thickness of 100 nm is epitaxially grown on the n$^-$-type InP layer 2b. On this p$^-$-type InP layer 2c, the p$^-$-type In$_{1-x}$Ga$_x$As$_{1-y}$P$_y$ layer 2d ($0 \leq x \leq 0.47$, $1 \geq y \geq 0$) having an impurity concentration of $1 \times 10^{17}$ cm$^{-3}$ and a thickness of 25 nm is epitaxially grown. The composition ratios x and y are determined such that the p$^-$-type In$_{1-x}$Ga$_x$As$_{1-y}$P$_y$ layer 2d achieves lattice matching with respect to the p$^-$-type InP layer 2c and such that the conduction bands of these layers 2d and 2c are smoothly connected to each other. That is, the value of x is gradually increased from the interface between the p$^-$-type InP layer 2c and the p$^-$-type In$_{1-x}$Ga$_x$As$_{1-y}$P$_y$ layer 2d toward the interface between the p$^-$-type In$_{1-x}$Ga$_x$As$_{1-y}$P$_y$ layer 2d and the p$^-$-type In$_{0.53}$Ga$_{0.47}$As layer 2e. On the other hand, the value of y is gradually decreased from the interface between the p$^-$-type InP layer 2c and the p$^-$-type In$_{1-x}$Ga$_x$As$_{1-y}$P$_y$ layer 2d toward the interface between the p$^-$-type In$_{1-x}$Ga$_x$As$_{1-y}$P$_y$ layer 2d and the p$^-$-type In$_{0.53}$Ga$_{0.47}$As layer 2e. Thereafter, the p$^-$-type In$_{0.53}$Ga$_{0.47}$As layer 2e having an impurity concentration of $1 \times 10^{17}$ cm$^{-3}$ and a thickness of 25 nm is epitaxially grown on the p$^-$-type In$_{1-x}$Ga$_x$As$_{1-y}$P$_y$ layer 2d.

The p$^+$-type In$_{0.53}$Ga$_{0.47}$As layer 3 having an impurity concentration of $1 \times 10^{19}$ cm$^{-3}$ and a thickness of 100 nm is epitaxially grown on the p$^-$-type In$_{0.53}$Ga$_{0.47}$As layer 2e. On this p$^+$-type layer 3, the n-type In$_{1-x}$Ga$_x$As$_{1-y}$P$_y$ layer 4a ($0.47 \leq x \leq 0$, $0 \leq y \leq 1$) having an Sn (impurities) concentration of $2 \times 10^{17}$ cm$^{-3}$ and a thickness of 50 nm is epitaxially grown. The is the same as that of the p$^-$-type In$_{1-x}$Ga$_x$As$_{1-y}$P$_y$ layer 2d. In order that the n-type In$_{1-x}$Ga$_x$As$_{1-y}$P$_y$ layer 4a achieves lattice matching with respect to the InP layer and that their conduction bands are smoothly connected together, the value of x is gradually increased from the interface between the p$^+$-type In$_{0.53}$Ga$_{0.47}$As layer 3 and the n-type In$_{1-x}$Ga$_x$As$_{1-y}$P$_y$ layer 4a toward the interface between the n-type In$_{1-x}$Ga$_x$As$_{1-y}$P$_y$ layer 4a and the n-type InP layer 4b. On the other hand, the value of y is gradually decreased from the interface between the p$^+$-type In$_{0.53}$Ga$_{0.47}$As layer 3 and the n-type In$_{1-x}$Ga$_x$As$_{1-y}$P$_y$ layer 4a toward the interface between the n-type In$_{1-x}$Ga$_x$As$_{1-y}$P$_y$ layer 4a and the n-type InP layer 4b. On the n-type In$_{1-x}$Ga$_x$As$_{1-y}$P$_y$ layer 4a, the n-type InP layer 4b having an impurity concentration of $2 \times 10^{17}$ cm$^{-3}$ and a thickness of 150 nm and the n$^+$-type InP layer 4c having an impurity concentration of $2 \times 10^{18}$ cm$^{-3}$ and a thickness of 100 nm are epitaxially grown.

With respect to the epitaxial wafer manufactured as mentioned above, an element-isolating insulation layer 8 is formed by implantation of H$^+$ ions such that it extends into the substrate 1. Further, an electrode-isolating insulation layer 9 is formed by implantation of B$^+$ ions such that it extends into the n$^+$-type InP layer 2a located in the interior of the transistor. By use of a predetermined mask, the epitaxial wafer is etched such that the etched-out region reaches the p$^+$-type In$_{0.5}$3Ga$_{0.47}$As layer 3, thereby exposing the base 3. Thereafter, a CVD-SiO$_2$ film 10 is formed on the resultant structure. In order to form an electrode contact in the collector region, a contact hole whose bottom reaches the n$^+$-type InP layer 2a is formed by etching. A thin GeAu/Au layer is first formed inside the contact hole, and then an Au layer is formed on the GeAu/Au layer, thereby providing a collector electrode 7. Further, contact holes are formed in both the emitter and base regions, and emitter and base electrodes 5 and 6 which are formed of GeAu/Au and Cr/Au, respectively, are provided in the contact holes of the emitter and base regions.

Figure 5:
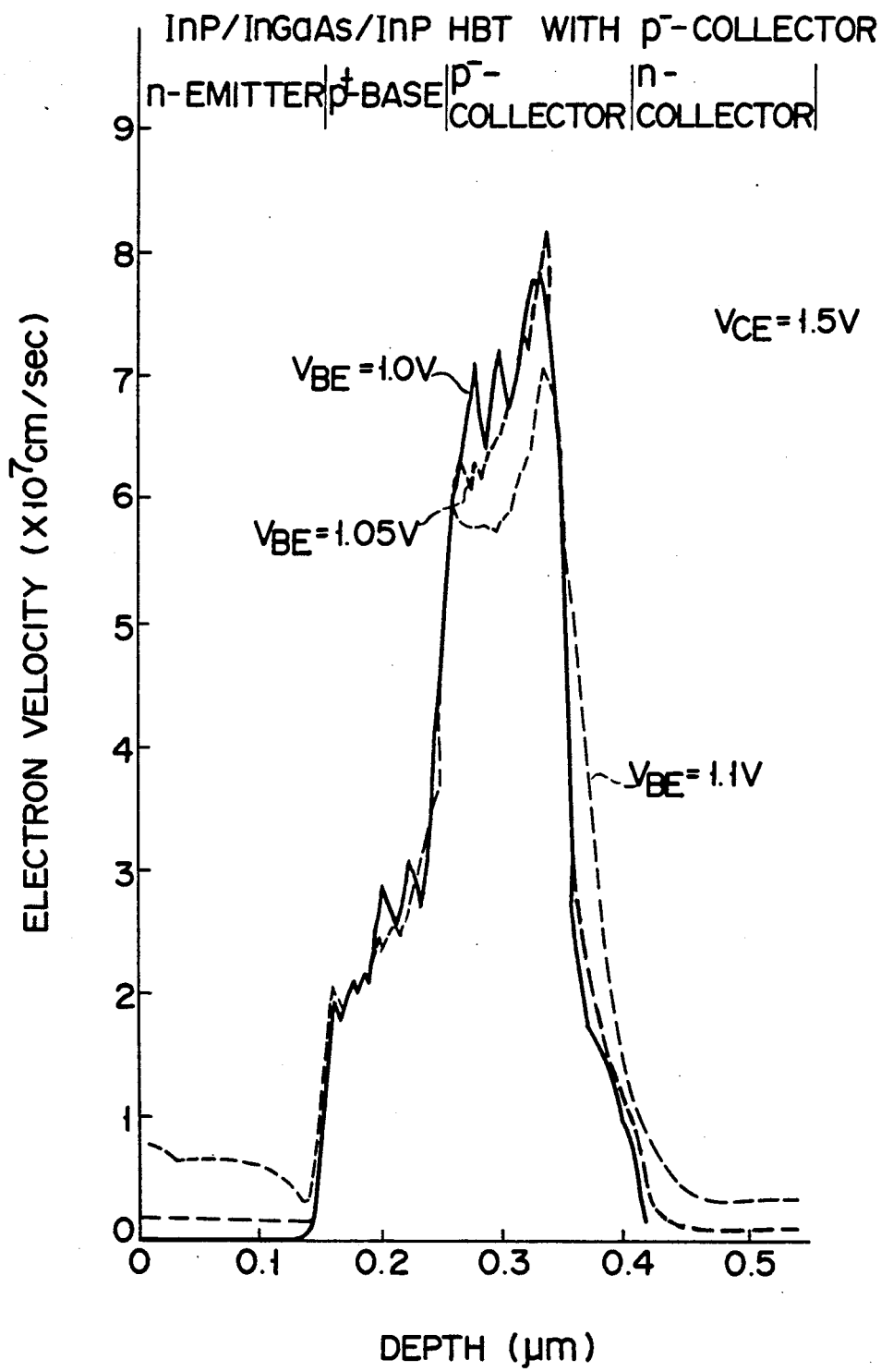
FIG. 5 is a graph showing the profile of the average electron velocity obtained in the heterojunction bipolar transistor of the first embodiment.

A transistor having substantially the same structure as the above-mentioned heterojunction bipolar transistor was subjected to a Monte Carlo simulation, so as to obtain the drift velocity distribution of the electrons in the element. This drift velocity distribution is shown in FIG. 5. In the calculation, the band gap is graded in order that the electrons injected into the base from the emitter are accelerated toward the collector. In other words, the base layer 3 is formed by an In$_{1-x}$Ga$_x$As$_y$P$_{1-y}$ layer ($0.5 \leq y \leq 1$). In the simulation, the heterojunction bipolar transistor was operated, with voltage V$_{CE}$ maintained at 1.5 V and with voltage V$_{BE}$ changed among 1.0 V, 1.05 V and 1.1 V. As can be seen from the graph shown in FIG. 5, the velocity overshooting of electrons occurred in the entire collection region.

Figure 6:
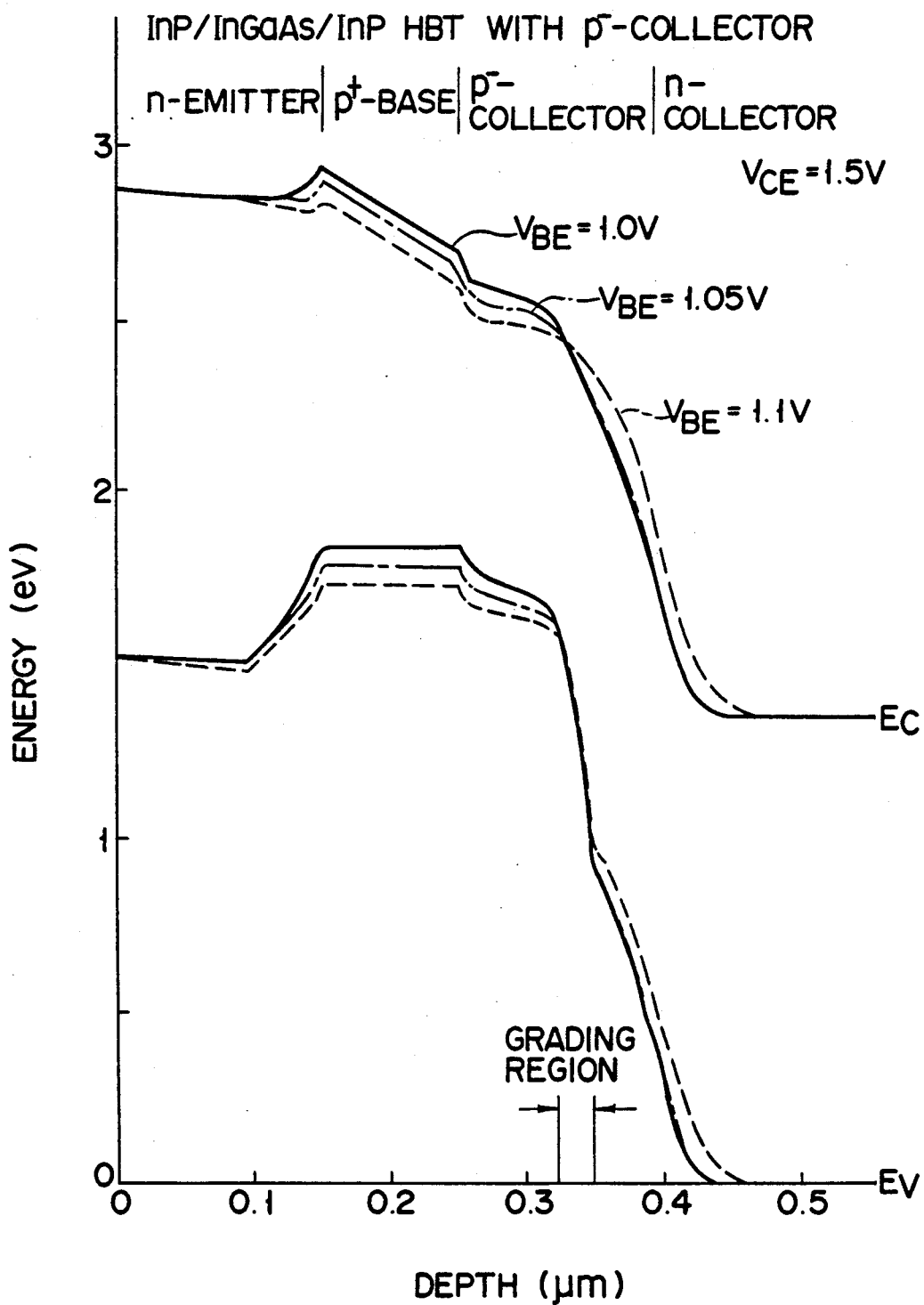
FIG. 6 is a graph showing how the band is when the heterojunction bipolar transistor of the first embodiment is operated.
Figure 7:
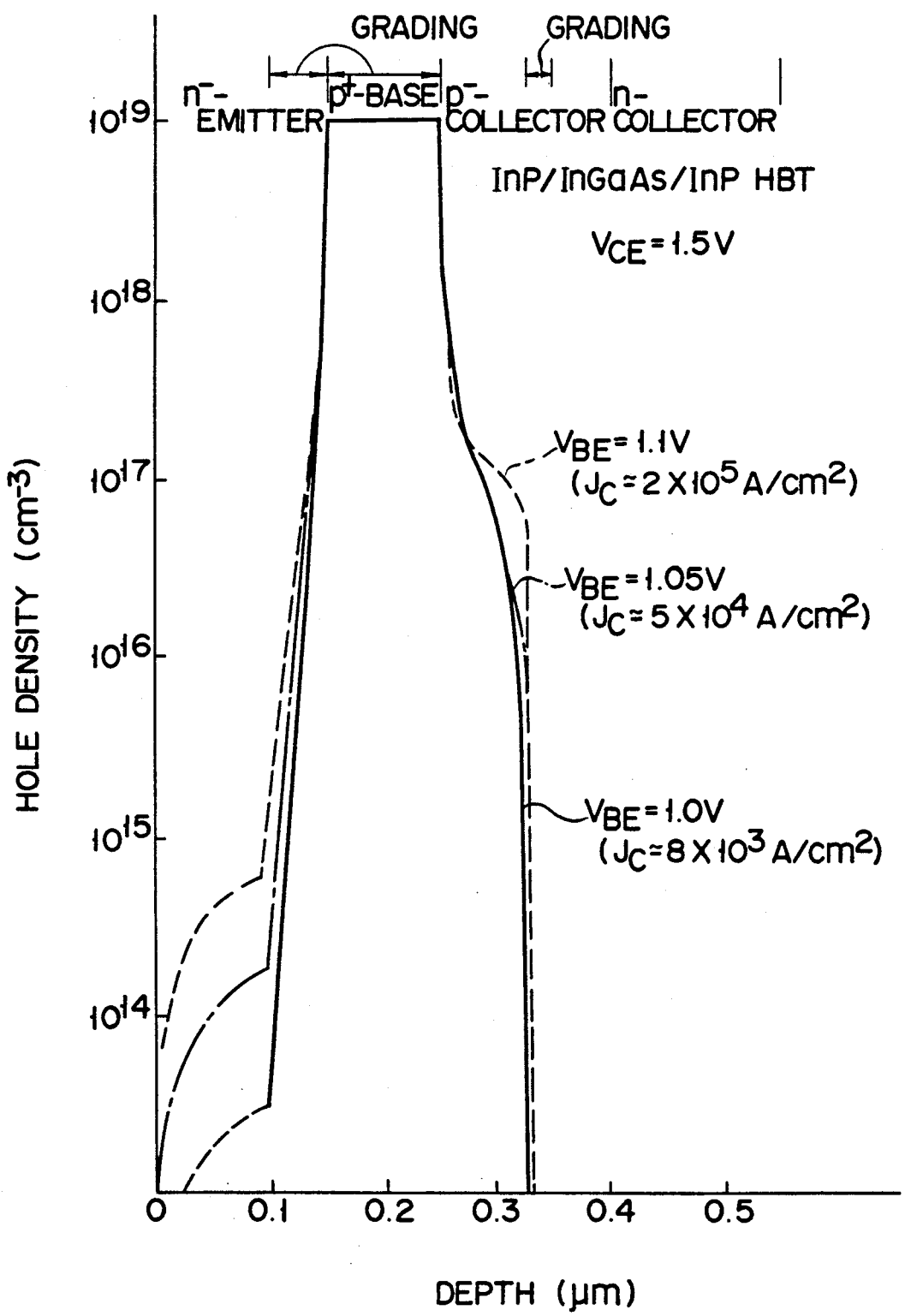
FIG. 7 is a graph showing the profile of the hole carrier obtained when the heterojunction bipolar transistor of the first embodiment is operated.

Under the same calculation conditions, the band structure and the carrier profile of holes were examined. The results are shown in FIGS. 6 and 7. As can be seen from FIG. 6, the conduction band is smoothly continuous in the collector region, so that the electrons are swiftly guided from the base to the collector. With respect to the valence band, it rises sharply in the grading region, so that it can be understood that a barrier against hole is formed in the grading region. As can be seen from FIG. 7, holes are blocked in the grading region of the collector region, so that they are not diffused in any portion of the collector region.

Figure 8:
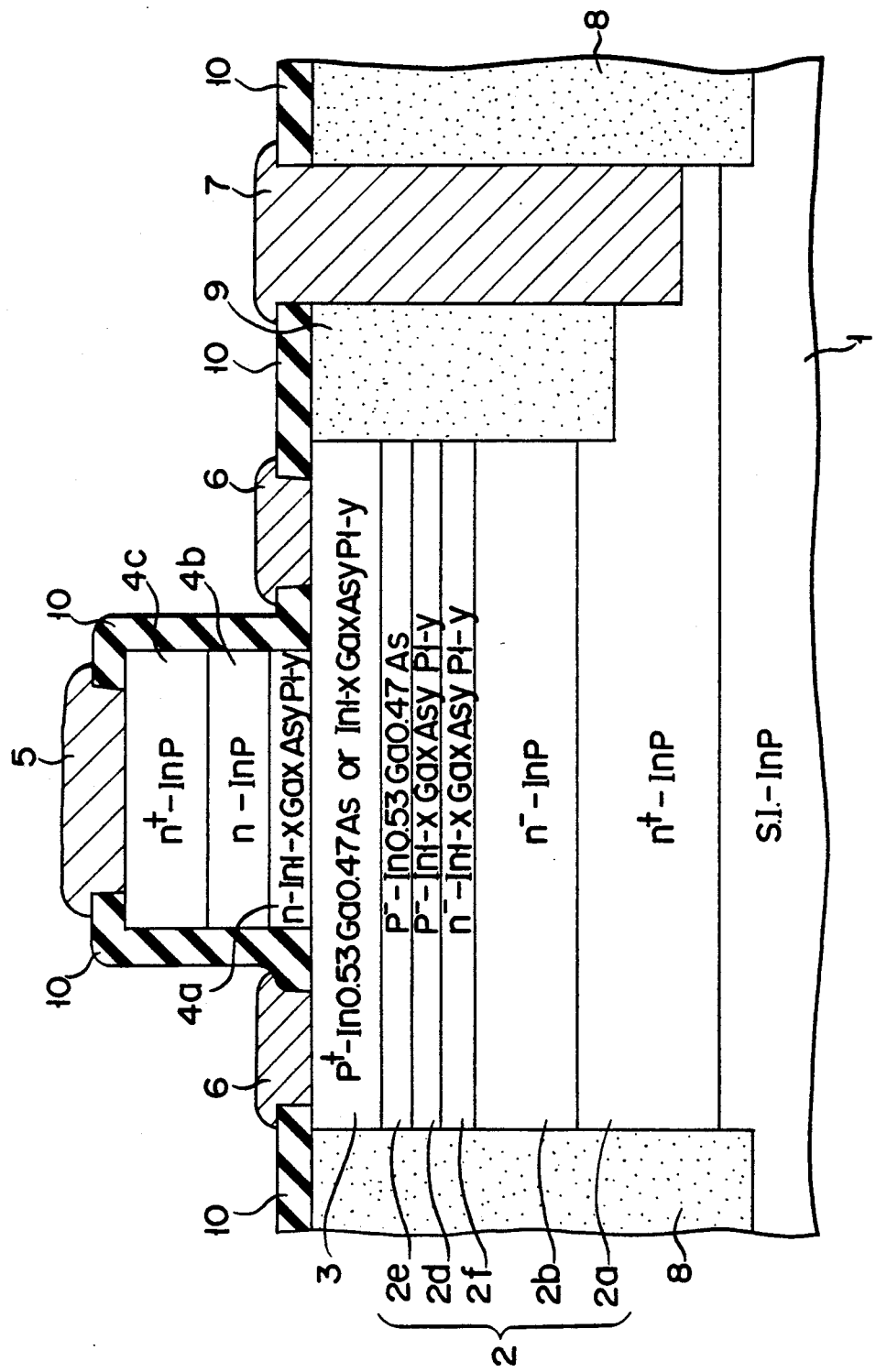
FIG. 8 is a sectional view of the heterojunction bipolar transistor according to the second embodiment of the present invention.

FIG. 8 shows the heterojunction bipolar transistor according to the second embodiment of the present invention. This embodiment differs from the first embodiment, in that an n$^-$-type In$_{1-x}$Ga$_x$As$_y$P$_{1-y}$ layer 2f is formed between the p$^-$-type In$_{1-x}$Ga$_x$As$_y$P$_{1-y}$ layer 2d and the n$^-$-type InP layer 2b. In other words, transition layers having different conductivity types are interposed between the p$^-$-type In$_{0.53}$Ga$_{0.47}$As 2e and the n$^-$-type InP layer 2b. With this construction, the second embodiment produces similar advantages to those of the first embodiment.

Figure 9:
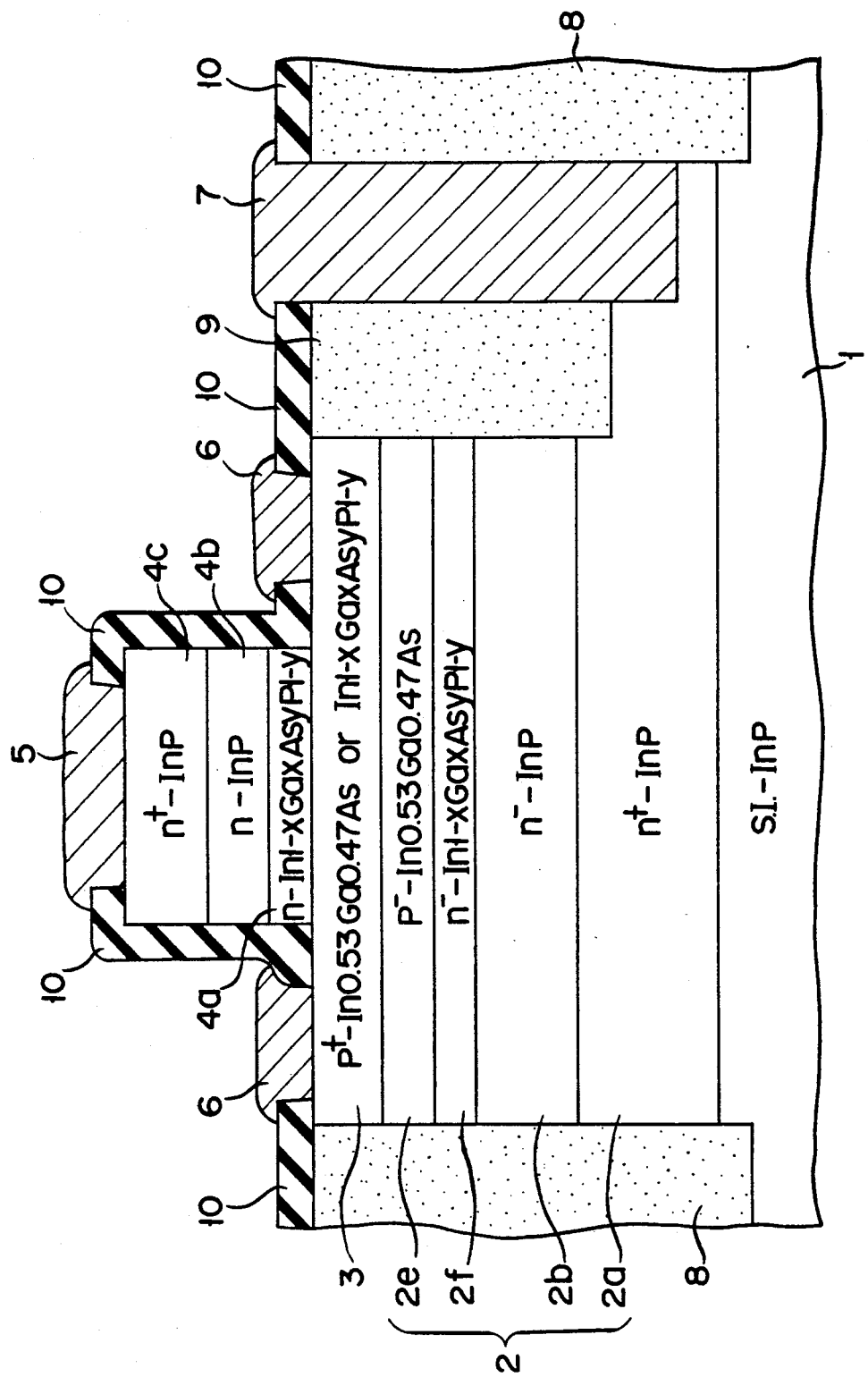
FIG. 9 is a sectional view of the heterojunction bipolar transistor according to the third embodiment of the present invention.

FIG. 9 shows the heterojunction bipolar transistor according to the third embodiment of the present invention. In this embodiment, the n$^-$-type In$_{1-x}$Ga$_x$As$_y$P$_{1-y}$ layer 2f is formed between the p$^-$-type In$_{0.53}$Ga$_{0.47}$As layer 2e and the n$^-$-type InP layer 2b. The n$^-$-type In$_{1-x}$Ga$_x$As$_y$P$_{1-y}$ layer 2f is a transition layer. Even if this transition layer 2f is provided within the n$^-$-type collector layer, similar advantages to those of the first embodiment are produced.

Figure 10:
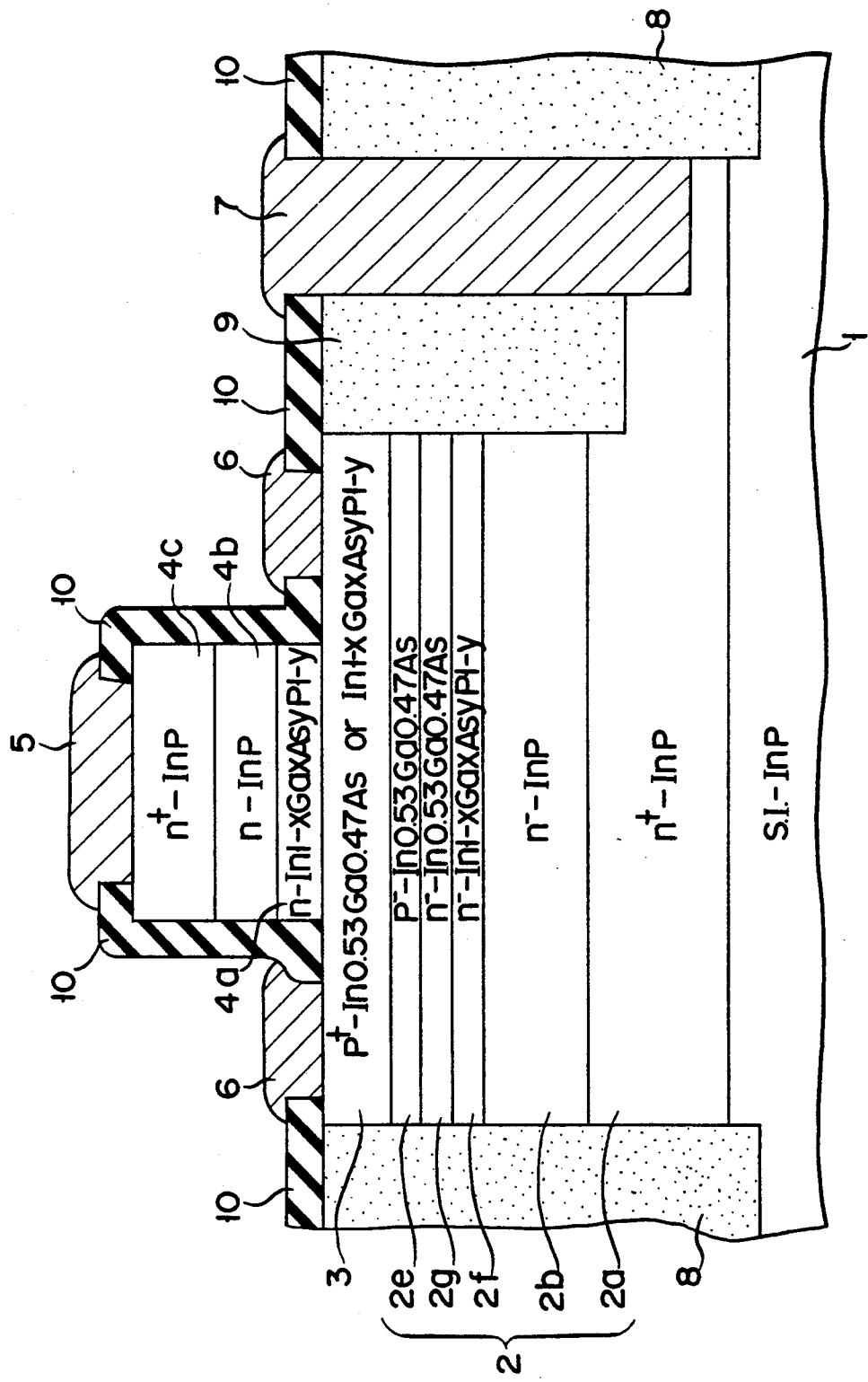
FIG. 10 is a sectional view of the heterojunction bipolar transistor according to the fourth embodiment of the present invention.

FIG. 10 shows the heterojunction bipolar transistor according to the fourth embodiment of the present invention. In this embodiment, the n$^-$-type In$_{1-x}$Ga$_x$As$_y$P$_{1-y}$ layer 2f is formed on the n$^-$-type InP layer 2b, and an n$^-$-type In$_{0.53}$Ga$_{0.47}$As layer 2g is formed on the n$^-$-type In$_{1-x}$Ga$_x$As$_y$P$_{1-y}$ layer 2f. In other words, transition layer 2f is formed within the collector layer such that it is isolated from the p$^-$-type In$_{0.53}$Ga$_{0.47}$As layer 2e. Even with this construction, similar advantages to those of the first embodiment are produced.

Figure 11:
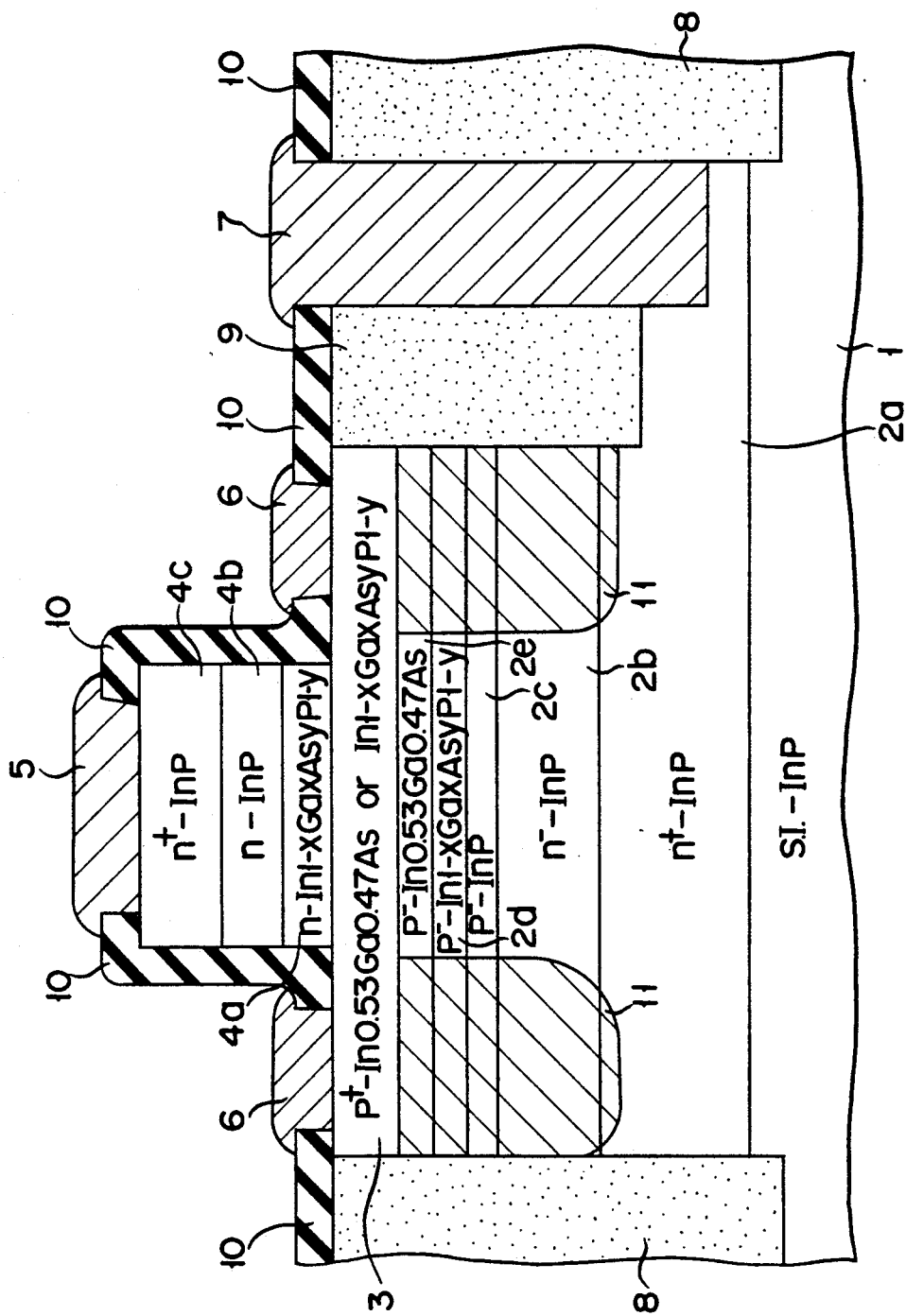
FIG. 11 is a sectional view of the heterojunction bipolar transistor according to the fifth embodiment of the present invention.

FIG. 11 shows the heterojunction bipolar transistor according to the fifth embodiment of the present invention. The basic construction of this embodiment is similar to that of the first embodiment. In the fifth embodiment, however, a high resistant layer 11 is formed, by implantation of H$^+$ ions, in that portion of the collector region which is located below the external base region.

In this manner, the collector junction capacity of the external base region is reduced.

Figure 12:
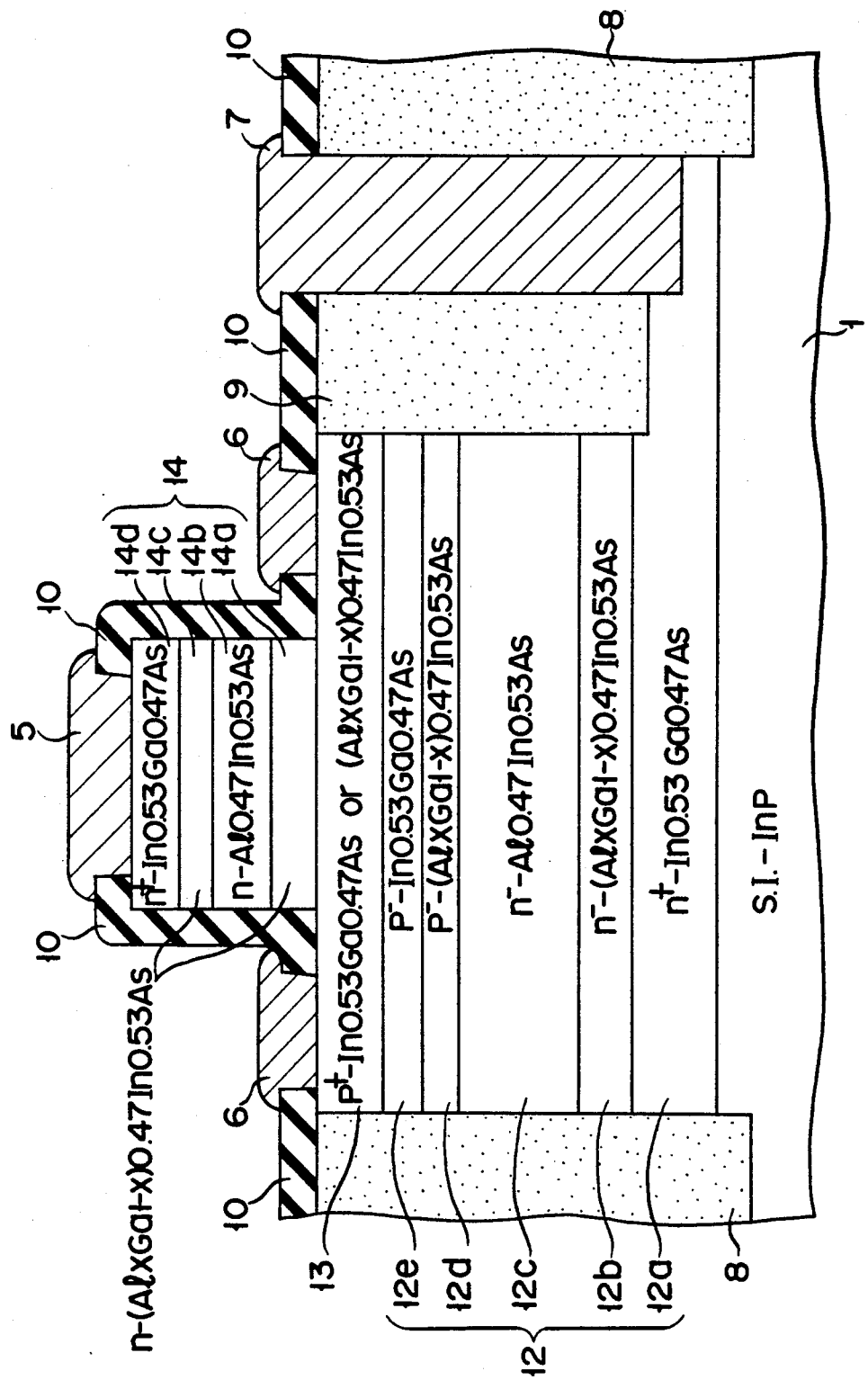
FIG. 12 is a sectional view of the heterojunction bipolar transistor according to the sixth embodiment of the present invention.

FIG. 12 shows the heterojunction bipolar transistor according to the sixth embodiment of the present invention. The heterojunction bipolar transistor of this embodiment uses semiconductor materials based on (InAl)As/InGaAs. More specifically, (InAl)As is used as a wide band gap material, while (InGa)As is used as a narrow band gap material. The mixed crystal ratio of each band gap material is determined in such a manner as to achieve lattice matching with respect to the InP layer. The grading region of the band gap in the collector region is determined such that it starts from the interior of the $p^-$-type collector region 12e and ends at the $p^-$-$n^-$ junction In order to obtain the heterojunction bipolar transistor of the sixth embodiment, semiconductor layers are epitaxially grown on the InP substrate 1 by use of either the MBE or the MOCVD process.

Figure 4:
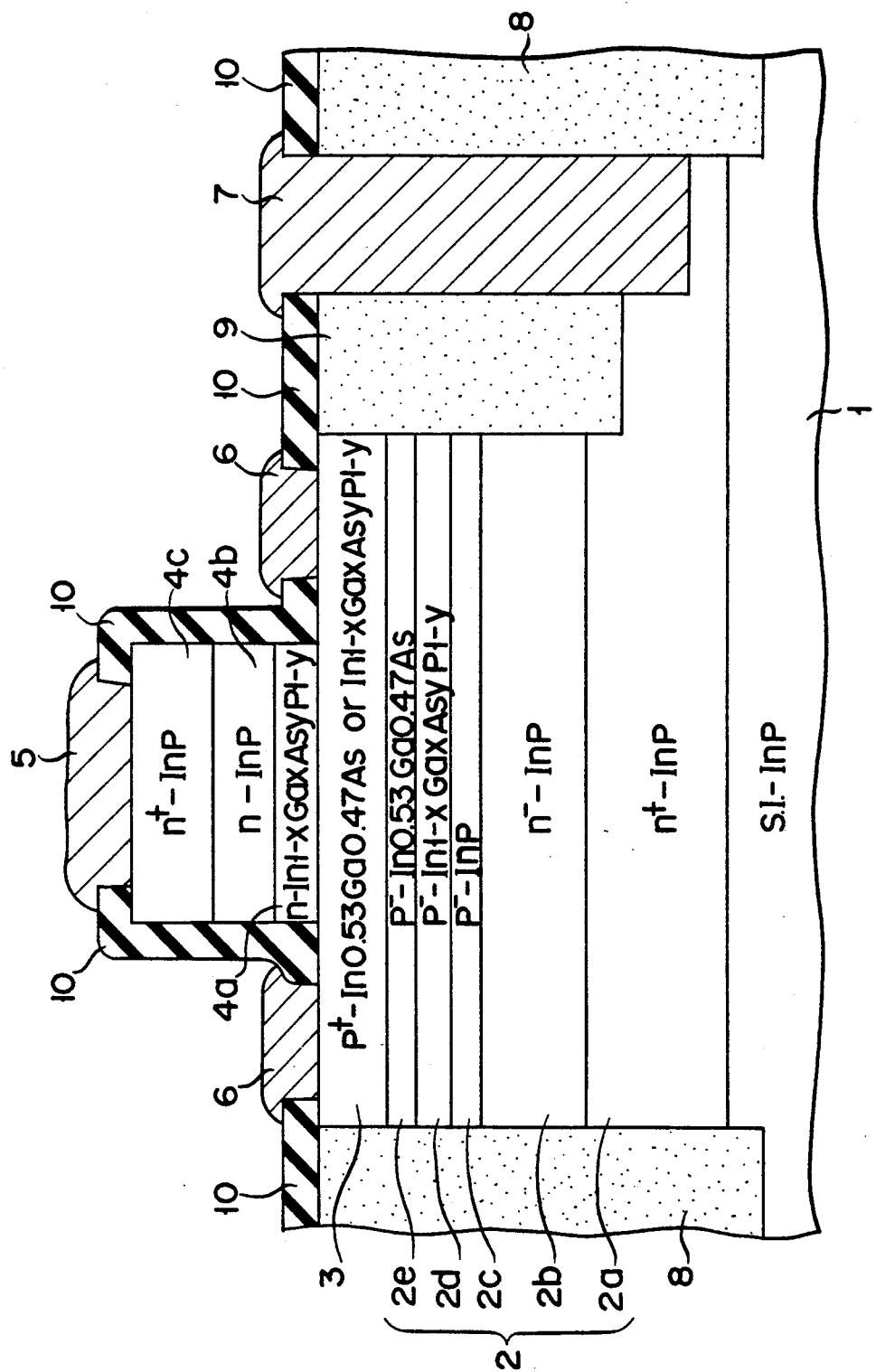
FIG. 4 is a sectional view of the heterojunction bipolar transistor according to the first embodiment of the present invention.

In FIG. 12, the same reference numerals are used to denote the structural elements corresponding to those of the first embodiment shown in FIG. 4. The heterojunction bipolar transistor of the sixth embodiment differs from that of the first embodiment, in the materials used for forming the collector layer 12, base layer 13, and emitter layer 14. More specifically, the n-type collector layer is made up of: a high-impurity concentration $n^+$-type $In_{0.53}Ga_{0.47}As$ layer 12a; an $n^-$-type $(Al_xGa_{1-x})_{0.47}In_{0.53}As$ layer 12b (which is a transition layer); and a low-impurity concentration $n^-$-type $Al_{0.47}In_{0.53}As$ layer 12c. In the meantime, the $p^-$-type collector layer is made up of: a $p^-$-type $(Al_xGa_{1-x})_{0.47}In_{0.53}As$ layer 12d (which is a transition layer); and a $p^-$-type $In_{0.53}Ga_{0.47}As$ layer 12e. The base layer 13 is formed by either a $p^+$-type $In_{0.53}Ga_{0.47}As$ layer or a $p^+$-type $(Al_xGa_{1-x})_{0.47}In_{0.53}As$ layer. The emitter layer 14 is made up of: an n-type $(Al_xGa_{1-x})_{0.47}In_{0.53}As$ layer 14a (which is a transition layer); an n-type $Al_{0.47}In_{0.53}As$ layer 14b; an n-type $(Al_xGa_{1-x})_{0.47}In_{0.53}As$ layer 14c; and an $n^+$-type $In_{0.53}Ga_{0.47}As$ layer 14d (which is a cap layer). The p layers 12e, 12d, the low-impurity concentration $n^-$-type layers 12c, 12b, and the high-impurity concentration $n^+$-type layer 12a of the collector layer 12 constitute the first, second and third collectors, respectively, and the impurity concentrations of these first to third collectors are determined in the same manner as in the first embodiment.

The advantages of the sixth embodiment are similar to those of the first embodiment.

Figure 13:
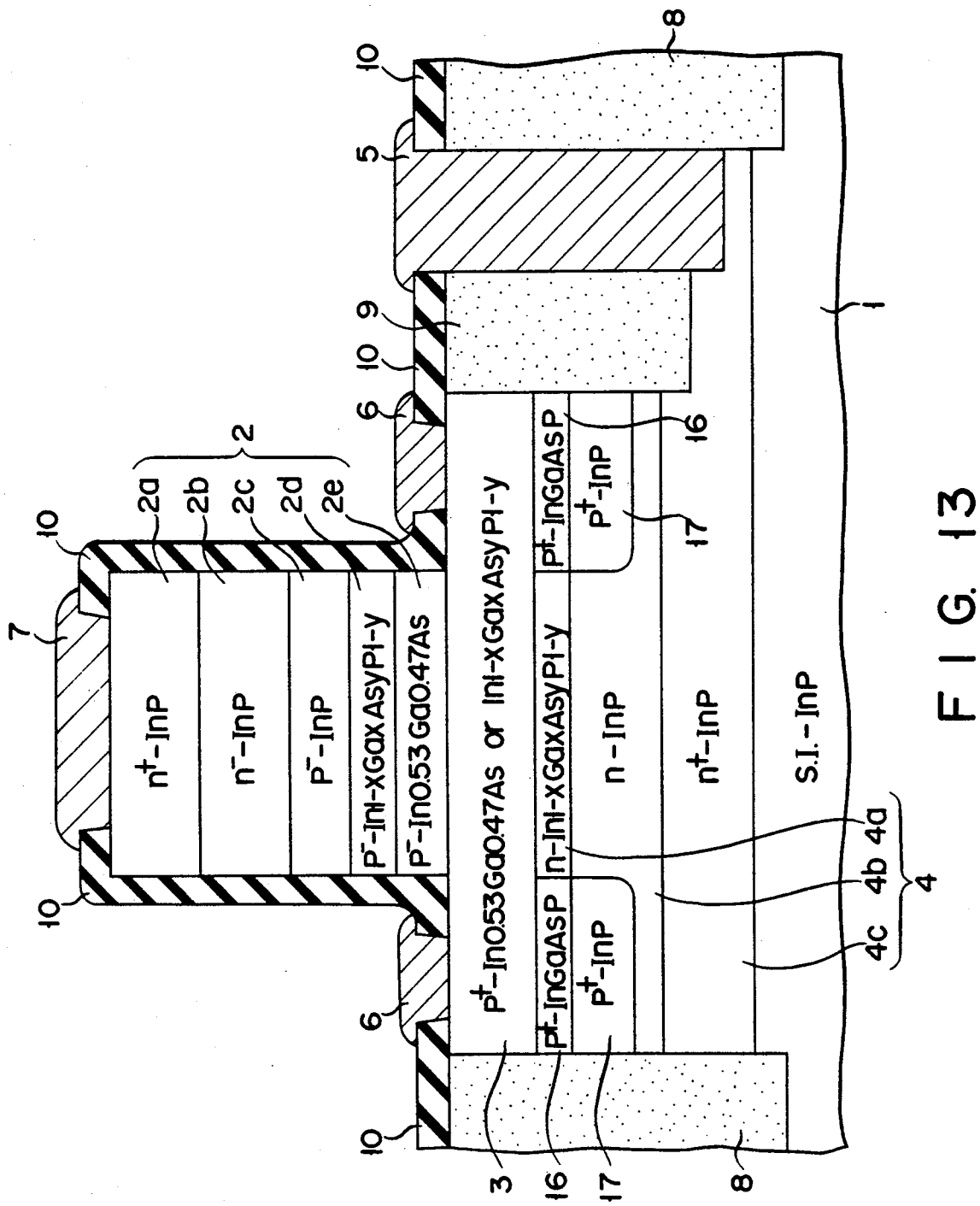
FIG. 13 is a sectional view of the heterojunction bipolar transistor according to the seventh embodiment of the present invention.

FIG. 13 shows the heterojunction bipolar transistor according to the seventh embodiment of the present invention. The heterojunction bipolar transistor of this embodiment uses semiconductor materials based on InP/(InGa)As. It is a so-called collector top type heterojunction bipolar transistor and is obtained by turning the heterojunction bipolar transistor of the first embodiment upside down. In FIG. 13, therefore, the structural elements corresponding to those of the first embodiment are denoted by the same reference numerals, and a detailed description of such structural elements will be omitted. Except for the order in which the collector layer 2, base layer 3, and emitter layer 4 are formed on the substrate, the heterojunction bipolar transistor shown in FIG. 13 is basically similar to that shown in FIG. 4. However, in order to reduce the area of the intrinsic emitter region, $p^+$-type external base regions 16 and 17 are formed by ion implantation or diffusion.

FIG. 14 shows the heterojunction bipolar transistor according to the eighth embodiment of the present invention. The heterojunction bipolar transistor of this embodiment uses semiconductor materials based on GaAs/(InGa)As. More specifically, GaAs is used as a wide band gap semiconductor material with which to form both the emitter and collector, while $In_{0.05}Ga_{0.95}As$ is used as a narrow band gap material with which to form the base. In other words, the collector layer 22, base layer 23, and emitter layer 24 are formed on the semi-insulating GaAs substrate 21, by use of semiconductor materials based on GaAs/(InGa)As. As for the other points, the heterojunction bipolar transistor of the eighth embodiment is similar to that shown in FIG. 4, so that the same reference numerals are used to denote the corresponding structural elements.

The heterojunction bipolar transistors of the first through seventh embodiments are of the lattice matching type. However, the transistor of the eighth embodiment is not. The heterojunction bipolar transistor of the eighth embodiment employs a GaAs substrate 21, and semiconductor layers are epitaxially grown on this substrate by use of either a MBE or MOCVD process. The thickness of the base region 23 has to be determined in such a way as not to cause mismatching dislocation. The specific manufacturing conditions of the eighth embodiment will be described below, from the formation of the $p^-$-type collector portion onward.

First, a $p^-$-type $In_xGa_{1-x}As$ layer 22d having a thickness of 20 nm is grown on a $p^-$-type GaAs layer 22c having a thickness of 50 nm. The value of x is varied such that it is zero at the interface with reference to an $p^-$-type GaAs layer 22c and is 0.05 at the interface with reference to a $p^-$-type $In_{0.05}Ga_{0.95}As$ layer 22e ($0 < x \leq 0.05$). The $p^-$-type $In_{0.05}Ga_{0.95}As$ layer 22e having a thickness of 30 nm is formed on the $p^-$-type $In_xGa_{1-x}As$ layer 22d. The impurity concentrations in the $p^-$-type layers 22c, 22d, 22e are $1 \times 10^{17}$ cm$^{-3}$, and these layers 22c, 22d, 22e jointly constitute a $p^-$-type collector layer. On this $p^-$-type collector layer, a $p^+$-type $In_{0.05}Ga_{0.95}As$ layer 23 having a thickness of 50 nm and used as a base layer is epitaxially grown. The impurity concentration in this $p^+$-type layer 23 is $5 \times 10^{19}$ cm$^{-3}$. An $n^+$-type $In_xGa_{1-x}As$ grading layer 24c ($0 < x < 0.5$) and an $n^+$-type $In_{0.5}Ga_{0.5}As$ layer 24d are formed as emitter cap layers. These layers 24c and 24d have an impurity concentration as high as $2 \times 10^{19}$ cm$^{-3}$, and have a thickness of 50 nm. The emitter cap layers 24c, 24d are formed for the purpose of reducing the emitter contact resistance. Since the mole ratio of In of the emitter cap layers is as high as 0.5, mismatching dislocation occurs in the emitter cap layers. This, however, does not adversely affect the characteristics of the transistor in practice. The band gap E g is 1.43 eV in the GaAs and is 1.39 eV in the $In_{0.5}Ga_{0.5}As$, and the band gap difference between the GaAs and the $In_{0.5}Ga_{0.5}As$ is small (i.e., 0.04 eV). However, since high-concentration impurities are doped in the base, he band gap difference is large in practice, due to the band gap reduction effect. Therefore, the effect of the emitter heterojunction is sufficient in practice.

Figure 15:
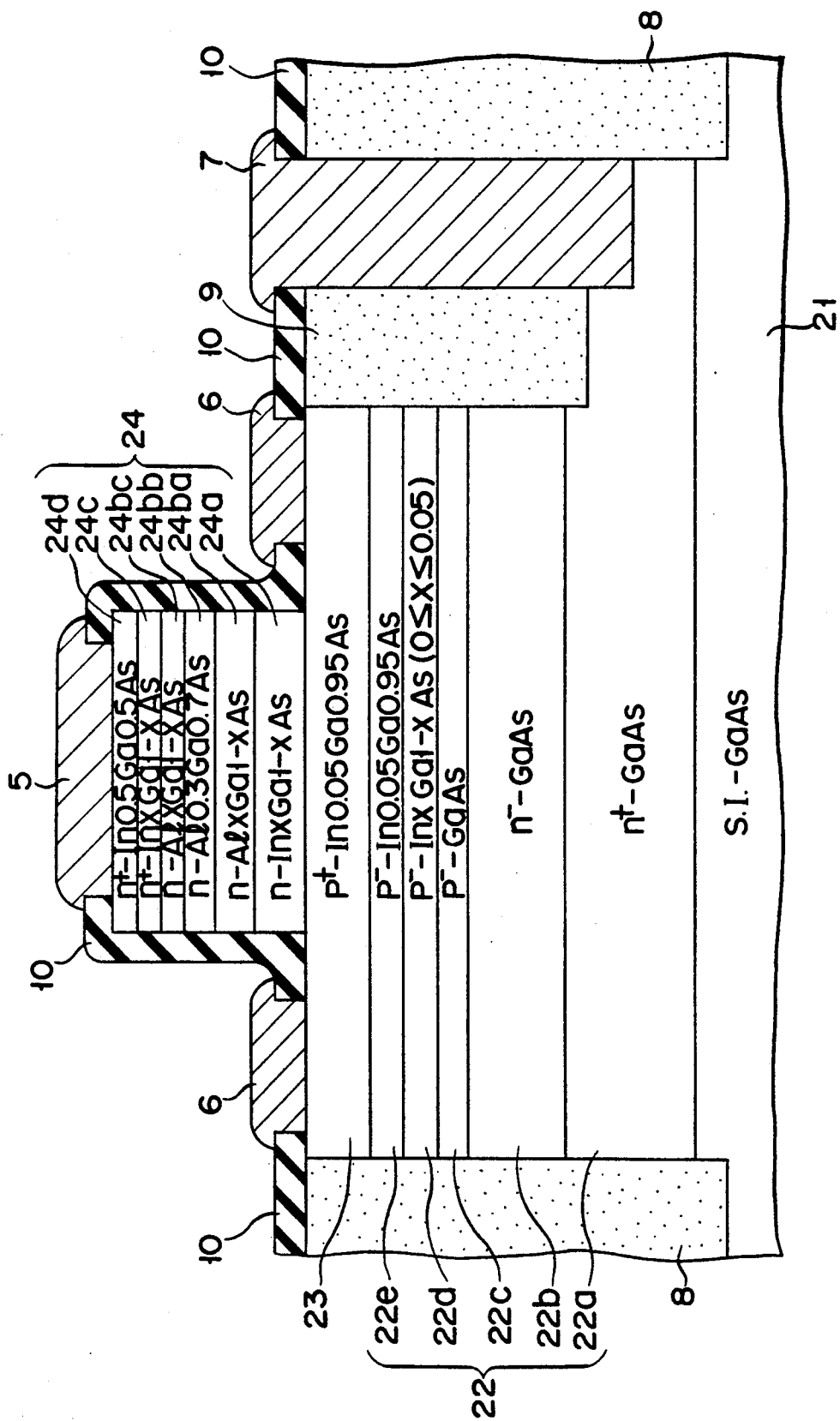
FIG. 15 is a sectional view of the heterojunction bipolar transistor according to the ninth embodiment of the present invention.

FIG. 15 shows the heterojunction bipolar transistor according to the ninth embodiment of the present invention. The heterojunction bipolar transistor of this embodiment uses semiconductor materials based on (Al Ga)As/(InGa)As/GaAs. More specifically, $Al_{0.3}Ga_{0.7}As$ and GaAs are used as wide band gap semiconductor materials with which to form the emitter 24 and collector 22, respectively, while In$_{0.05}$Ga$_{0.95}$As is used as a narrow band gap material with which to form the base 23. Like the transistor of the eighth embodiment, the heterojunction bipolar transistor of the ninth embodiment is not a lattice matching type. It differs from the transistor of the eighth embodiment, in that the emitter portion formed by the n-type GaAs layer 24b is replaced with an Al$_x$Ga$_{1-x}$As layer 24ba (0<x<0.3), an Al$_{0.3}$Ga$_{0.7}$As layer 24bb, and an Al$_x$Ga$_{1-x}$As layer 24bc (0<x<0.5). As for the other constructions, the ninth embodiment is similar to the eighth embodiment. With respect to the ninth embodiment, it should be noted that Al$_{0.3}$Ga$_{0.7}$As having a wide band gap of 1.8 eV is used for forming the emitter. Therefore, the transistor characteristics of the ninth embodiment, such as a current amplification factor $h_{FE}$, are slightly superior to those of the eighth embodiment.

What is claimed is:

1. A double heterojunction bipolar transistor, comprising:
   a first conductivity type emitter layer;
   a second conductivity type base layer which is in contact with the emitter layer and forms a first heterojunction in conjunction with the emitter layer; and
   a collector layer which is in contact with the base layer, said collector layer being made up of a first conductivity type semiconductor layer and a second conductivity type semiconductor layer and including a second conductivity type low-impurity concentration layer which is in contact with the base layer such that the low-impurity concentration layer has an impurity concentration lower than that of the base layer, said collector layer forming a second heterojunction in conjunction with the base layer, the second heterojunction including a transition layer which is formed such that the band gap thereof varies stepwise or smoothly, said transition layer being isolated from the base layer, and said emitter layer and said collector layer being formed of a semiconductor material having a band gap wider than that of the base layer.

2. A double heterojunction bipolar transistor according to claim 1, wherein said transition layer is formed in contact with the low-impurity concentration layer, and is isolated from both the base layer and the first conductivity type semiconductor layer.

3. A double heterojunction bipolar transistor according to claim 1, wherein said transition layer is in contact with the low-impurity concentration layer, and includes a second conductivity type region in contact with the low-impurity concentration layer and a first conductivity region in contact with the second conductivity type region.

4. A double heterojunction bipolar transistor according to claim 1, wherein the first heterojunction between the base layer and the collector layer includes a transition layer which is formed such that the band gap thereof varies stepwise or smoothly, said transition layer being of the first conductivity type and formed in that portion of the first conductivity type semiconductor layer which is located outside of the low-impurity concentration region.

5. A double heterojunction bipolar transistor according to claim 1, wherein:
   said collector layer includes a first collector layer which is of the same conductivity type as the base layer, a second collector layer which is of a different conductivity type from that of the base layer, and a third collector layer which is of the same conductivity type as the second collector layer, said first collector layer being closest to the base layer and said third collector layer being farthest from the base layer;
   said first, second and third collector layers satisfy the following relationship:

$$N_1 < N_2 \leq N_3$$

where $N_1$ denotes the impurity concentration in the first collector layer, $N_2$ denotes the impurity concentration in the second collector layer, and $N_3$ denotes the impurity concentration in the third collector layer; and
   said first collector layer is not completely depleted when a zero bias is applied.

6. A double heterojunction bipolar transistor according to claim 1, wherein said base layer includes an external base region, and that portion of the collector layer which is located under the external base region is formed by a high resistant layer.

7. A double heterojunction bipolar transistor according to claim 1, wherein said collector layer includes:
   a first conductivity type high-impurity concentration layer;
   a first conductivity type first transition layer formed on the high-impurity concentration layer;
   a first conductivity type low-impurity concentration layer formed on the first transition layer; a second conductivity type second transition layer formed on the low-impurity concentration layer; and
   the second conductivity type low-impurity concentration layer formed on the second transition layer, said second transition layer being formed such that the band gap thereof varies stepwise or smoothly.

8. A double heterojunction bipolar transistor according to claim 1, wherein said double heterojunction bipolar transistor is of a collector top structure.

9. A double heterojunction bipolar transistor according to claim 1, wherein said emitter layer includes semiconductor layers which are combined in such a manner as to cause lattice mismatching.

10. A double heterojunction bipolar transistor according to claim 1, wherein said emitter layer includes an Al$_{0.3}$Ga$_{0.7}$As layer having a wide band gap.

* * * * *